United States Patent
Nemoto et al.

(10) Patent No.: US 8,399,902 B2
(45) Date of Patent: Mar. 19, 2013

(54) LIGHT EMITTING DEVICE AND METHOD OF MANUFACTURING LIGHT EMITTING DEVICE

(75) Inventors: Takahiro Nemoto, Osaka (JP); Toshio Hata, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 338 days.

(21) Appl. No.: 12/851,195

(22) Filed: Aug. 5, 2010

(65) Prior Publication Data

US 2011/0031525 A1  Feb. 10, 2011

(30) Foreign Application Priority Data

Aug. 5, 2009 (JP) .................................. 2009-182517

(51) Int. Cl.
    *H01L 33/00* (2010.01)
(52) U.S. Cl. .................. 257/99; 257/100; 257/E33.058; 257/E33.059; 257/E33.066; 257/E33.072
(58) Field of Classification Search .................. 257/99, 257/100, E33.058, E33.059, E33.066, E33.072; 438/26
See application file for complete search history.

(56) References Cited

U.S. PATENT DOCUMENTS

| | | | |
|---|---|---|---|
| 7,771,093 B2 | 8/2010 | Kishikawa et al. | |
| 7,910,946 B2 | 3/2011 | Kamada | |
| 2004/0188697 A1 | 9/2004 | Brunner et al. | |
| 2005/0280017 A1* | 12/2005 | Oshio et al. | 257/99 |
| 2006/0101757 A1 | 5/2006 | Tsuzuki et al. | |
| 2008/0048201 A1 | 2/2008 | Kim et al. | |
| 2008/0296592 A1 | 12/2008 | Osamu | |

FOREIGN PATENT DOCUMENTS

| | | |
|---|---|---|
| CN | 1758458 A | 4/2006 |
| CN | 101315963 A | 12/2008 |
| JP | 2004-534405 A | 11/2004 |
| JP | 2004-363537 | 12/2004 |
| JP | 2005-353914 A | 12/2005 |
| JP | 2006-54410 A | 2/2006 |
| JP | 2007-096108 | 4/2007 |
| JP | 2007-280983 | 10/2007 |
| JP | 2008-16744 A | 1/2008 |
| JP | 2008-047712 | 2/2008 |
| JP | 2008-53726 | 3/2008 |
| JP | 2008-091864 | 4/2008 |
| JP | 2008-300386 | 12/2008 |
| JP | 2009-009956 | 1/2009 |
| WO | WO 2007/069399 | 6/2007 |

OTHER PUBLICATIONS

U.S. Appl. No. 13/216,548, filed Aug. 24, 2011, entitled "Light Emitting Device".

* cited by examiner

*Primary Examiner* — Tu-Tu Ho
(74) *Attorney, Agent, or Firm* — Nixon & Vanderhye P.C.

(57) ABSTRACT

A light emitting device includes a light emitting diode chip, and a first lead terminal in which a bottom portion including a mounting region for the light emitting diode chip is formed, and a side wall continuing to the bottom portion and having an inner surface serving as a reflecting surface for light emitted from the light emitting diode chip is continuously formed. Further, the light emitting device includes a second lead terminal provided to be spaced from the first lead terminal. Furthermore, the light emitting device includes a resin portion which supports the first lead terminal and the second lead terminal, and in which a cavity exposing a portion of the second lead terminal and the mounting region in the first lead terminal is formed.

13 Claims, 7 Drawing Sheets

LIGHT EMITTING DEVICE AND METHOD OF MANUFACTURING LIGHT EMITTING DEVICE

This nonprovisional application is based on Japanese Patent Application No. 2009-182517 filed on Aug. 5, 2009 with the Japan Patent Office, the entire contents of which are hereby incorporated by reference.

BACKGROUND

1. Technical Field

The technology presented herein relates to a light emitting device and a method of manufacturing a light emitting device, and in particular to a light emitting diode package and a method of manufacturing a light emitting diode package.

2. Description of the Background Art

Generally, a light emitting device using a light emitting diode chip is formed by mounting the light emitting diode chip in a package having a variety of forms, depending on intended use. Japanese Patent Laying-Open No. 2008-053726 is a prior document disclosing a light emitting diode package capable of improving light emitting efficiency of a light emitting device.

In the light emitting diode package described in Japanese Patent Laying-Open No. 2008-053726, a reflecting surface formed by bending a portion of a lead terminal is employed to improve light emitting efficiency and reduce discoloration of a package main body.

Further, Japanese Patent Laying-Open No. 2009-009956 is a prior document disclosing a package for a semiconductor light emitting device capable of enhancing the action of dissipating heat generated from a semiconductor light emitting element and suppressing deterioration of luminance of the semiconductor light emitting element.

In the package for a semiconductor light emitting device described in Japanese Patent Laying-Open No. 2009-009956, a lead portion continues from an opening edge of a cup portion and is exposed from a resin portion, in a main surface of the package serving as a peripheral edge of a storage portion for the semiconductor light emitting element. Thus, an exposed surface is formed outside the resin portion in the entire lead portion. As a result, heat dissipation property in the lead portion is improved, and deterioration of luminance of the semiconductor light emitting element due to increased temperature is suppressed.

Further, in the package for a semiconductor light emitting device described in Japanese Patent Laying-Open No. 2009-009956, since a side portion and a bottom portion of the cup portion are integrally molded by press-drawing or etching, no seam or break is formed in a reflector. As a result, formation of a resin burr due to leak of a resin material from a seam or a break into the inside of the reflector is prevented. Furthermore, since the cup portion has a flange portion extending along the package main surface at the opening edge, formation of a resin burr due to leak of the resin material into the cup portion during resin molding is prevented.

Japanese Patent Laying-Open No. 2007-096108 is a prior document disclosing a light emitting device having an improved heat dissipation property and preventing deterioration of a sealing member. In the light emitting device described in Japanese Patent Laying-Open No. 2007-096108, an LED element is mounted on a light reflecting surface of a metal case having a portion thereof exposed to the outside. As a result, the metal case serves as a heat sink, improving heat dissipation property of the light emitting device.

Japanese Patent Laying-Open No. 2004-363537 is a prior document disclosing a semiconductor device having an improved accuracy in being mounted on another member. In the semiconductor device described in Japanese Patent Laying-Open No. 2004-363537, accuracy in being mounted on another member and strength of adhesion to another member are improved by providing a first main surface and a second main surface in a main surface of a package as a support.

Japanese Patent Laying-Open No. 2008-300386 is a prior document disclosing a semiconductor light emitting device that can serve as both a side view type and a top view type and has an improved light extraction efficiency. In the semiconductor light emitting device described in Japanese Patent Laying-Open No. 2008-300386, a reflecting surface is formed at a bent portion as a portion of a lead frame, and a terminal portion of the lead frame has a structure serving as a top view type or a side view type. As a result, the semiconductor light emitting device can serve as both a side view type and a top view type, and has an improved light extraction efficiency.

In the light emitting diode package described in Japanese Patent Laying-Open No. 2008-053726, since the reflecting surface is formed by bending a portion of the lead terminal, there exists a seam or break in the reflecting surface. Therefore, a resin material enters from the seam or break onto the reflecting surface, and a resin burr occurs. If a resin burr occurs, luminance of light reflected by the reflecting surface is reduced, thus preventing improvement of light extraction efficiency of the light emitting device.

In the package for a semiconductor light emitting device described in Japanese Patent Laying-Open No. 2009-009956, since the flange portion of the cup portion is formed to extend along the package main surface, joining of the lead portion to the resin portion is insufficient. Accordingly, a lock portion is additionally provided to prevent separation of the lead portion and the resin portion. In this case, however, a resin molding die becomes complicated, causing an increase in manufacturing cost.

Other prior documents have no description about the problems described above.

SUMMARY

One feature of the present technology is to provide a light emitting device capable of suppressing reduction of luminance of a light emitting element by preventing occurrence of a resin burr on a reflecting surface, and improving reliability of the device at an inexpensive cost by strengthening joining of a lead terminal to a resin portion.

A light emitting device in accordance with the example embodiments presented herein includes a light emitting element, and a first lead terminal in which a bottom portion including a mounting region for the light emitting element is formed, and a side wall continuing to the bottom portion and having an inner surface serving as a reflecting surface for light emitted from the light emitting element is continuously formed. Further, the light emitting device includes a second lead terminal provided to be spaced from the first lead terminal. Furthermore, the light emitting device includes a resin portion which supports the first lead terminal and the second lead terminal, and in which a cavity exposing a portion of the second lead terminal and the mounting region in the first lead terminal is formed. A collar portion provided to continuously extend from an upper end of the side wall is formed in the first lead terminal. A portion of an upper surface of the collar portion is covered with the resin portion in a vicinity of an outer peripheral end of the collar portion.

According to the light emitting device described above, since the side wall continuing to the bottom portion of the first lead terminal is continuously formed, there is no seam or break in the bottom portion and the side wall, preventing a resin burr in the resin portion from occurring on the reflecting surface.

Further, since a portion of the upper surface of the collar portion is covered with the resin portion in the vicinity of the outer peripheral end of the collar portion, the first lead terminal and the resin portion are joined such that the resin portion surrounds the vicinity of the outer peripheral end of the collar portion. Therefore, joining of the first lead terminal to the resin portion is strengthened, the risk of separation of the first lead terminal from the resin portion is reduced, and the light emitting device has an improved reliability. Since there is no necessity to additionally provide a lock portion for maintaining joining of the first lead terminal to the resin portion, a molding die for the resin portion can be simplified, suppressing an increase in manufacturing cost.

Furthermore, since a portion of the upper surface of the collar portion of the first lead terminal is not covered with the resin portion on the periphery of an upper end of the inner surface of the side wall, a resin burr in the resin portion is prevented from occurring on the inner surface of the side wall serving as the reflecting surface. By preventing occurrence of a resin burr on the reflecting surface as described above, reduction of luminance of the light emitted from the light emitting element is suppressed.

In the light emitting device in accordance with the present embodiments, the first lead terminal may have a first terminal portion projecting outside the resin portion in a shape of a flat plate, and the second lead terminal may have a second terminal portion projecting outside the resin portion in a shape of a flat plate. In this case, the first terminal portion and the second terminal portion are respectively electrically connected to outside on first side surfaces both facing an identical plane, among side surfaces parallel to respective thickness directions of the first terminal portion and the second terminal portion.

According to the light emitting device described above, since there is no need to bend the first lead terminal and the second lead terminal after molding the resin portion, joining of the resin portion to the first lead terminal and the second lead terminal can be prevented from being weakened.

Preferably, step portions preventing a member connecting the first terminal portion and the second terminal portion to the outside from moving upward are formed in respective second side surfaces adjacent to the first side surfaces electrically connected to the outside, among the side surfaces parallel to the respective thickness directions of the first terminal portion and the second terminal portion.

According to the light emitting device described above, the connection member is prevented from moving upward onto the second side surfaces adjacent to the first side surfaces connected to the outside, in the first terminal portion and the second terminal portion.

In the light emitting device in accordance with the present embodiments, in the second lead terminal, an extended bottom portion is formed such that the bottom portion of the first lead terminal is extended, and an extended side wall continuing to the extended bottom portion is continuously formed. Further, in the second lead terminal, an extended collar portion provided to continuously extend from an upper end of the extended side wall is formed. A portion of an upper surface of the extended collar portion is covered with the resin portion in a vicinity of an outer peripheral end of the extended collar portion.

According to the light emitting device described above, since the extended side wall continuing to the extended bottom portion of the second lead terminal is continuously formed, a resin burr in the resin portion is prevented from occurring below the reflecting surface, by forming the resin portion using a die in the shape covering a seam or break portion between the extended bottom portion and the extended side wall of the second lead terminal and the bottom portion and the side wall of the first lead terminal.

Further, since a portion of the upper surface of the extended collar portion is covered with the resin portion in the vicinity of the outer peripheral end of the extended collar portion, the second lead terminal and the resin portion are joined such that the resin portion surrounds the vicinity of the outer peripheral end of the extended collar portion. Therefore, joining of the second lead terminal to the resin portion is strengthened, the risk of separation of the second lead terminal from the resin portion is reduced, and the light emitting device has an improved reliability. Since there is no necessity to additionally provide a lock portion for maintaining joining of the second lead terminal to the resin portion, a molding die for the resin portion can be simplified, suppressing an increase in manufacturing cost.

Furthermore, since a portion of the upper surface of the extended collar portion of the second lead terminal is not covered with the resin portion on the periphery of an upper end of an inner surface of the extended side wall, a resin burr in the resin portion is prevented from occurring on the inner surface of the extended side wall serving as the reflecting surface. By preventing occurrence of a resin burr on the reflecting surface as described above, reduction of luminance of the light emitted from the light emitting element is suppressed.

Preferably, in the first lead terminal, the bottom portion, the side wall, and the collar portion are formed integrally by drawing. By performing drawing, the first lead terminal can be formed without having a seam or a break between the bottom portion, the side wall, and the collar portion. Further, the first lead terminal can be mass produced, reducing manufacturing cost.

Preferably, in the second lead terminal, the extended bottom portion, the extended side wall, and the extended collar portion are formed integrally by drawing. By performing drawing, the second lead terminal can be formed without having a seam or a break between the extended bottom portion, the extended side wall, and the extended collar portion. Further, the second lead terminal can be mass produced, reducing manufacturing cost.

In the light emitting device in accordance with the present embodiments, a wavelength conversion member converting a wavelength of the light emitted from the light emitting element may be provided inside a concave portion formed by the bottom portion and the side wall of the first lead terminal.

According to the light emitting device described above, deterioration of an inner wall of the resin portion in which the cavity is formed due to light reaching the inner wall is suppressed by converting the light emitted from the light emitting element into long-wavelength light having low energy.

In the light emitting device in accordance with the present embodiments, a wavelength conversion member converting a wavelength of the light emitted from the light emitting element may be provided inside a concave portion formed by the extended bottom portion and the extended side wall of the second lead terminal.

According to the light emitting device described above, deterioration of an inner wall of the resin portion in which the cavity is formed due to light reaching the inner wall is suppressed by converting the light emitted from the light emitting element into long-wavelength light having low energy.

In the light emitting device in accordance with the present embodiments, a light-transmitting mold member may be provided inside the cavity.

According to the light emitting device described above, the inside of the cavity is sealed without reduction of luminance of the light from the light emitting element.

In the light emitting device in accordance with the present embodiments, a wavelength conversion member converting a wavelength of the light emitted from the light emitting element may be provided inside the cavity.

According to the light emitting device described above, deterioration of an inner wall of the resin portion in which the cavity is formed due to light reaching the inner wall is suppressed by converting the light emitted from the light emitting element into long-wavelength light having low energy.

In the light emitting device in accordance with the present embodiments, bonding wires respectively connecting the first lead terminal and the second lead terminal with the light emitting element may be included. The bonding wires may be disposed inside a concave portion formed by the bottom portion and the side wall of the first lead terminal, and inside a concave portion formed by the extended bottom portion and the extended side wall of the second lead terminal.

According to the light emitting device described above, since the bonding wires can be sealed inside a single resin provided inside the concave portions of the first lead terminal and the second lead terminal, the risk that the bonding wires may be cut due to the effect of thermal expansion of resins and the like is reduced.

A method of manufacturing a light emitting device in accordance with the present embodiments includes the step of forming a bottom portion including a mounting region for a light emitting element, a side wall continuing to the bottom portion and having an inner surface serving as a reflecting surface for light emitted from the light emitting element, and a collar portion provided to extend from an upper end of the side wall, in a first lead terminal by drawing. Further, the method of manufacturing a light emitting device includes the steps of mounting the light emitting element on the first lead terminal, and insert molding the first lead terminal and a second lead terminal disposed to be spaced from the first lead terminal inside a resin portion. In the step of insert molding, a portion of a die forming an inner wall of the resin portion constituting a cavity exposing a portion of the second lead terminal and the mounting region in the first lead terminal is in contact with an upper surface of the collar portion of the first lead terminal on a periphery of an upper end of the inner surface of the side wall.

According to the method of manufacturing a light emitting device described above, since the side wall continuing to the bottom portion of the first lead terminal is formed by drawing, there is no seam or break in the bottom portion and the side wall, preventing a resin burr in the resin portion from occurring on the reflecting surface. Further, since the upper surface of the collar portion is in contact with a portion of the die forming the inner wall of the resin portion constituting the cavity on the periphery of the upper end of the inner surface of the side wall in the step of insert molding, a resin burr in the resin portion can be prevented from occurring from the upper surface of the collar portion to the reflecting surface of the side wall.

By preventing occurrence of a resin burr on the reflecting surface as described above, reduction of luminance of the light emitted from the light emitting element can be suppressed. Since there is no necessity to additionally provide a lock portion for maintaining joining of the lead terminal to the resin portion, a molding die for the resin portion can be simplified, suppressing an increase in manufacturing cost.

The method of manufacturing a light emitting device in accordance with the present embodiments may further include the step of forming an extended bottom portion, an extended side wall continuing to the extended bottom portion, and an extended collar portion provided to extend from an upper end of the extended side wall, in the second lead terminal by drawing, such that the bottom portion, the side wall, and the collar portion of the first lead terminal are extended. In the step of insert molding, a portion of the die forming the inner wall of the resin portion constituting the cavity exposing a portion of the second lead terminal and the mounting region in the first lead terminal is in contact with the upper surface of the collar portion of the first lead terminal on the periphery of the upper end of the inner surface of the side wall, and in contact with an upper surface of the extended collar portion of the second lead terminal on a periphery of an upper end of an inner surface of the extended side wall.

According to the method of manufacturing a light emitting device described above, since the extended side wall continuing to the extended bottom portion of the second lead terminal is formed by drawing, there is no seam or break in the extended bottom portion and the extended side wall, preventing a resin burr in the resin portion from occurring on the reflecting surface. Further, since the upper surface of the extended collar portion is in contact with a portion of the die forming the inner wall of the resin portion constituting the cavity on the periphery of the upper end of the inner surface of the extended side wall in the step of insert molding, a resin burr in the resin portion can be prevented from occurring from the upper surface of the extended collar portion to the reflecting surface of the extended side wall.

By preventing occurrence of a resin burr on the reflecting surface as described above, reduction of luminance of the light emitted from the light emitting element can be suppressed. Since there is no necessity to additionally provide a lock portion for maintaining joining of the lead terminals to the resin portion, a molding die for the resin portion can be simplified, suppressing an increase in manufacturing cost.

According to the present embodiments, since the side wall continuing to the bottom portion of the first lead terminal is continuously formed, there is no seam or break in the bottom portion and the side wall, preventing a resin burr in the resin portion from occurring on the reflecting surface.

Further, since a portion of the upper surface of the collar portion is covered with the resin portion in the vicinity of the outer peripheral end of the collar portion, the first lead terminal and the resin portion are joined such that the resin portion surrounds the vicinity of the outer peripheral end of the collar portion. Therefore, joining of the first lead terminal to the resin portion is strengthened, the risk of separation of the first lead terminal from the resin portion is reduced, and the light emitting device has an improved reliability. Since there is no necessity to additionally provide a lock portion for maintaining joining of the first lead terminal to the resin portion, a molding die for the resin portion can be simplified, suppressing an increase in manufacturing cost.

Furthermore, since a portion of the upper surface of the collar portion of the first lead terminal is not covered with the resin portion on the periphery of an upper end of the inner surface of the side wall, a resin burr in the resin portion is prevented from occurring on the inner surface of the side wall serving as the reflecting surface. By preventing occurrence of a resin burr on the reflecting surface as described above, reduction of luminance of the light emitted from the light emitting element is suppressed.

The foregoing and other features, aspects and advantages of the present embodiments will become more apparent from the following detailed description of the present embodiments when taken in conjunction with the accompanying drawings.

DESCRIPTION OF THE PREFERRED EMBODIMENTS

Hereinafter, a light emitting device in Embodiment 1 will be described with reference to the drawings.

Embodiment 1

Figure 1:
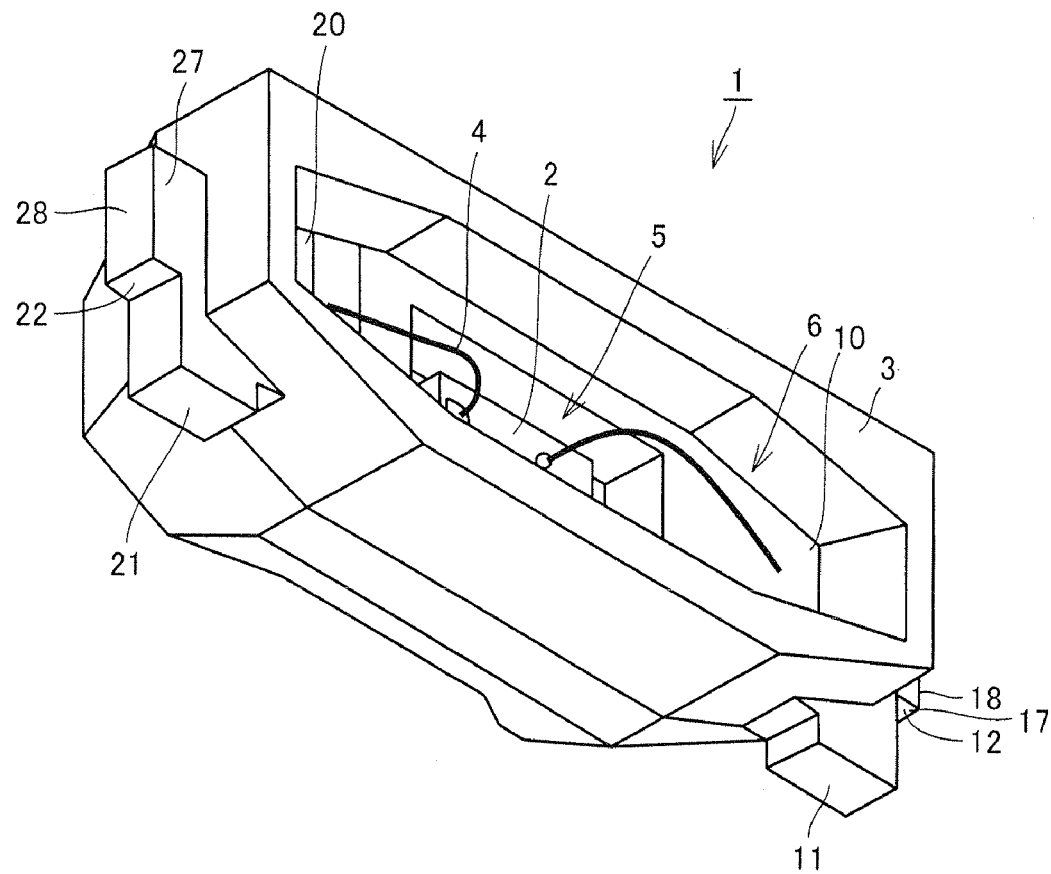
FIG. 1 is a perspective view showing a configuration of a light emitting device in accordance with Embodiment 1.
Figure 2:
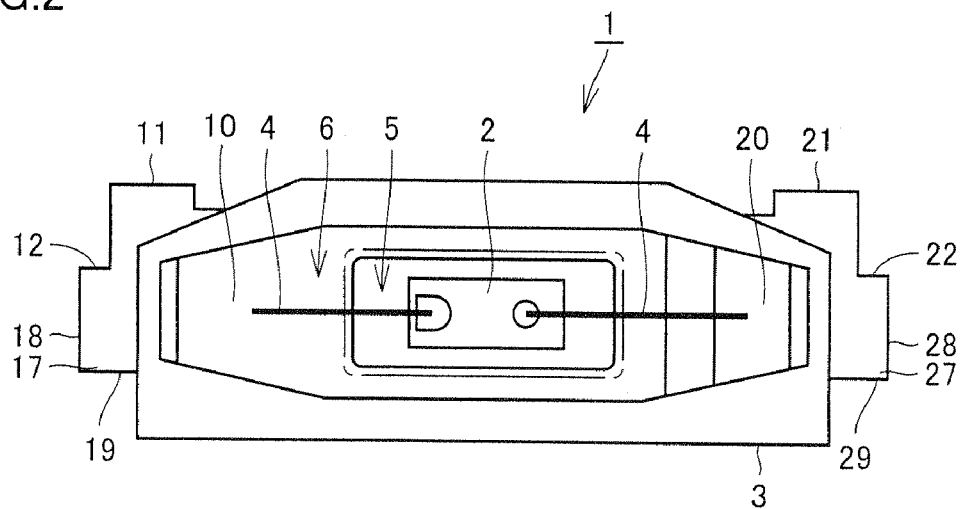
FIG. 2 is a plan view showing the configuration of the light emitting device in accordance with Embodiment 1.

FIG. 1 is a perspective view showing a configuration of a light emitting device in accordance with Embodiment 1. FIG. 2 is a plan view showing the configuration of the light emitting device in accordance with the present embodiment. As shown in FIGS. 1 and 2, a light emitting device 1 in accordance with Embodiment 1 includes a light emitting diode chip 2 as a light emitting element, a resin portion 3, bonding wires 4, a first lead terminal 10, and a second lead terminal 20.

Light emitting diode chip 2 is stored inside a concave portion 5 formed in the first lead terminal 10, and thus mounted. Light emitting diode chip 2 is connected to each of the first lead terminal 10 and the second lead terminal 20 by two bonding wires 4. A cavity 6 is formed in resin portion 3.

As light emitting diode chip 2, a GaN-based blue light emitting diode chip having a width of 0.3 mm and a length of 0.6 mm is used.

Figure 3:
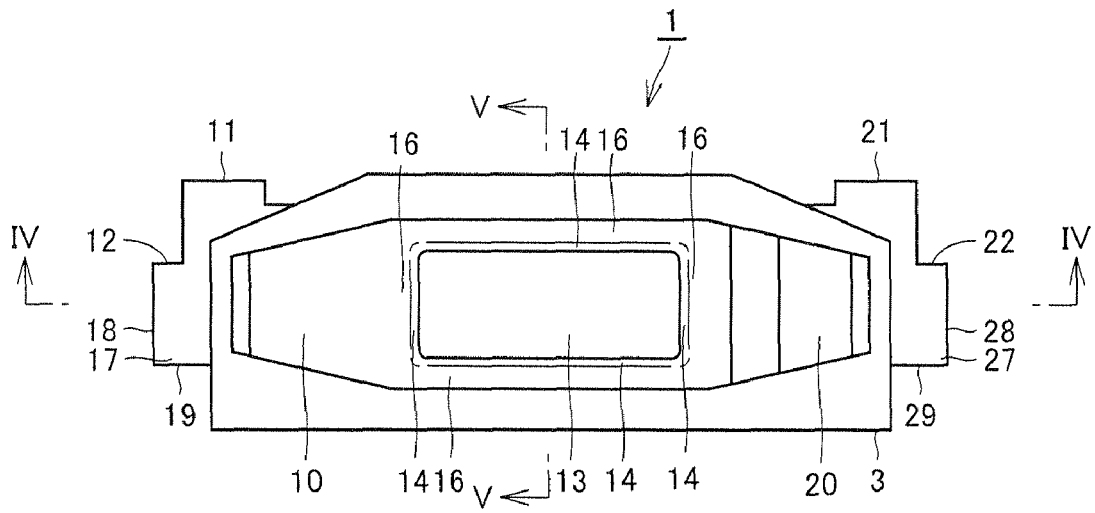
FIG. 3 is a partial plan view showing a structure of the light emitting device in accordance with Embodiment 1.
Figure 4:
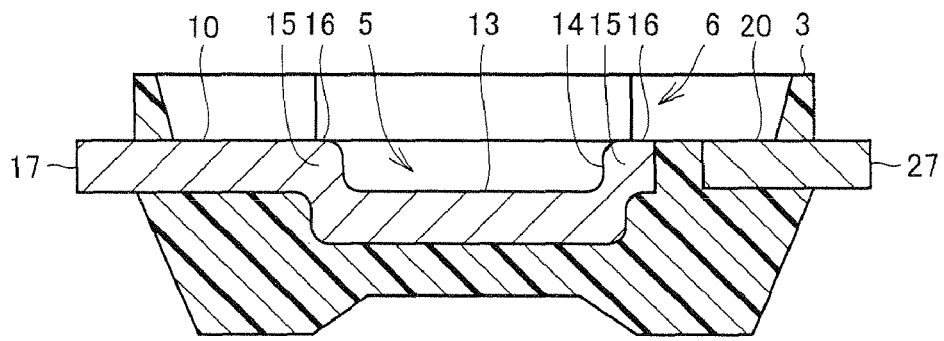
FIG. 4 is a cross sectional view taken along line IV-IV in FIG. 3 and seen in the direction of arrows.
Figure 5:
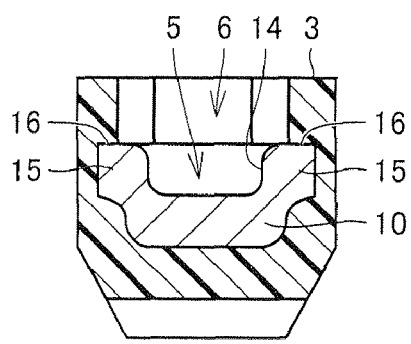
FIG. 5 is a cross sectional view taken along line V-V in FIG. 3 and seen in the direction of arrows.

FIG. 3 is a partial plan view showing a structure of the light emitting device in accordance with the present embodiment. FIG. 4 is a cross sectional view taken along line IV-IV in FIG. 3 and seen in the direction of arrows. FIG. 5 is a cross sectional view taken along line V-V in FIG. 3 and seen in the direction of arrows. In FIGS. 3 to 5, light emitting diode chip 2 and bonding wires 4 are not shown for convenience of description.

As shown in FIGS. 3 to 5, a flat bottom portion 13 serving as a mounting region for light emitting diode chip 2 is formed in the first lead terminal 10. Further, a side wall 14 continuing to bottom portion 13 is continuously formed in the first lead terminal 10. Bottom portion 13 and side wall 14 constitute concave portion 5. Side wall 14 has an inner surface serving as a reflecting surface for light emitted from light emitting diode chip 2. The light reflected by side wall 14 passes through cavity 6 in resin portion 3, and is emitted from light emitting device 1.

Side wall 14 is formed to be slightly inclined with respect to an upper surface of bottom portion 13 such that an opening of concave portion 5 widens as it approaches a side on which cavity 6 in resin portion 3 is located. In the present embodiment, concave portion 5 has a shape with a short side of 0.4 mm, a long side of 1 mm, and a depth of 0.2 mm. Cavity 6 has a shape with a short side of 0.6 mm, a long side of 2.4 mm, and a depth of 0.3 mm.

By disposing light emitting diode chip 2 inside concave portion 5 in the first lead terminal 10, the light emitted from light emitting diode chip 2 is reflected by side wall 14 in a light emitting direction of light emitting device 1, and thus the light is less likely to reach an inner wall of resin portion 3 facing cavity 6 in resin portion 3. As a result, deterioration of the inner wall of resin portion 3 facing cavity 6 in resin portion 3 is suppressed, and reduction of luminance of the light emitted from light emitting device 1 is decreased.

Further, a collar portion 15 provided to continuously extend from an upper end of side wall 14 is formed in the first lead terminal 10. Bottom portion 13, side wall 14, and collar portion 15 of the first lead terminal 10 are formed by drawing. By using drawing, the first lead terminal 10 is formed without having a seam or a break in bottom portion 13, side wall 14, and collar portion 15. Further, since drawing is adaptable to mass production, manufacturing cost can be reduced.

The second lead terminal 20 is provided to be spaced from the first lead terminal 10. In other words, the first lead terminal 10 and the second lead terminal 20 disposed to be spaced from the first lead terminal 10 are insert molded inside resin portion 3. In the present embodiment, a portion of resin portion 3 is provided between the first lead terminal 10 and the second lead terminal 20.

Resin portion 3 supports the first lead terminal 10 and the second lead terminal 20. Cavity 6 formed in resin portion 3 exposes a portion of the second lead terminal 20 and the mounting region for light emitting diode chip 2 in the first lead terminal 10. Resin portion 3 is formed by insert molding the first lead terminal 10 and the second lead terminal 20.

A portion of an upper surface 16 of collar portion 15 of the first lead terminal 10 is covered with resin portion 3 in the vicinity of an outer peripheral end of collar portion 15. Specifically, upper surface 16 of collar portion 15 of the first lead terminal 10 is covered with resin portion 3 in the vicinity of the outer peripheral end of collar portion 15 along a longitudinal direction of the first lead terminal 10.

Thus, the first lead terminal 10 and resin portion 3 are joined such that resin portion 3 surrounds the vicinity of the outer peripheral end of collar portion 15. Therefore, joining of the first lead terminal 10 to resin portion 3 is strengthened, the risk of separation of the first lead terminal 10 from resin portion 3 is reduced, and the light emitting device has an improved reliability.

Further, since the light from light emitting diode chip 2 reflected by side wall 14 of the first lead terminal 10 is less likely to reach the inner wall of resin portion 3 facing cavity 6 in resin portion 3 by increasing the area of upper surface 16 of collar portion 15, deterioration of the inner wall of resin portion 3 facing cavity 6 in resin portion 3 is reduced.

Since there is no necessity to additionally provide a lock portion for maintaining joining of the first lead terminal 10 and the second lead terminal 20 to resin portion 3 as described above, a molding die for resin portion 3 can be simplified, suppressing an increase in manufacturing cost. Therefore, light emitting device 1 can be produced at an inexpensive cost, with enhanced reliability.

In the first lead terminal 10, a first terminal portion 17 projecting outside resin portion 3 in the shape of a flat plate is formed. The first terminal portion 17 is not subjected to bending. In the second lead terminal 20, a second terminal portion 27 projecting outside resin portion 3 in the shape of a flat plate is formed. The second terminal portion 27 is not subjected to bending.

The first terminal portion 17 of the first lead terminal 10 and the second terminal portion 27 of the second lead terminal 20 are respectively electrically connected to outside lands not shown, on first side surfaces 11 and 21 both facing an identical plane, among side surfaces 11, 18, 19, 21, 28, and 29 parallel to respective thickness directions.

Further, in the first terminal portion 17 of the first lead terminal 10, a step portion 12 is formed in second side surface 18 adjacent to the first side surface 11 among side surfaces 11, 18, and 19 parallel to the thickness direction of the first terminal portion 17. Step portion 12 has a function of preventing a member connecting the first terminal portion 17 to the outside from moving upward onto the second side surface 18 in which step portion 12 is formed.

Similarly, in the second terminal portion 27 of the second lead terminal 20, a step portion 22 is formed in second side surface 28 adjacent to the first side surface 21 among side surfaces 21, 28, and 29 parallel to the thickness direction of the second terminal portion 27. Step portion 22 has a function of preventing a member connecting the second terminal portion 27 to the outside from moving upward onto the second side surface 28 in which step portion 22 is formed.

In the present embodiment, the first lead terminal 10 and the second lead terminal 20 are each formed of a lead frame fabricated by working a 0.2 mm-thick metal plate of a copper alloy. The first lead terminal 10 is coated with silver plating with a film thickness of 5 μm to improve light reflectivity in side wall 14. As a metal used for plating, Cu, Ni, Au, an Al alloy, a Mg alloy, an alloy of Al and Mg, or the like can be used. Resin portion 3 is formed of a polyphthalamide resin. The polyphthalamide resin is a white resin and has a property of reflecting light.

In the present embodiment, there is no need to perform bending on the first lead terminal 10 and the second lead terminal 20. Therefore, joining of the first lead terminal 10 and the second lead terminal 20 to resin portion 3 can be prevented from being weakened, and light emitting device 1 has an improved reliability. Specifically, joining of the first lead terminal 10 and the second lead terminal 20 to resin portion 3 joined by insert molding is prevented from being weakened, by performing bending on the first lead terminal 10 and the second lead terminal 20 thereafter.

Figure 6:
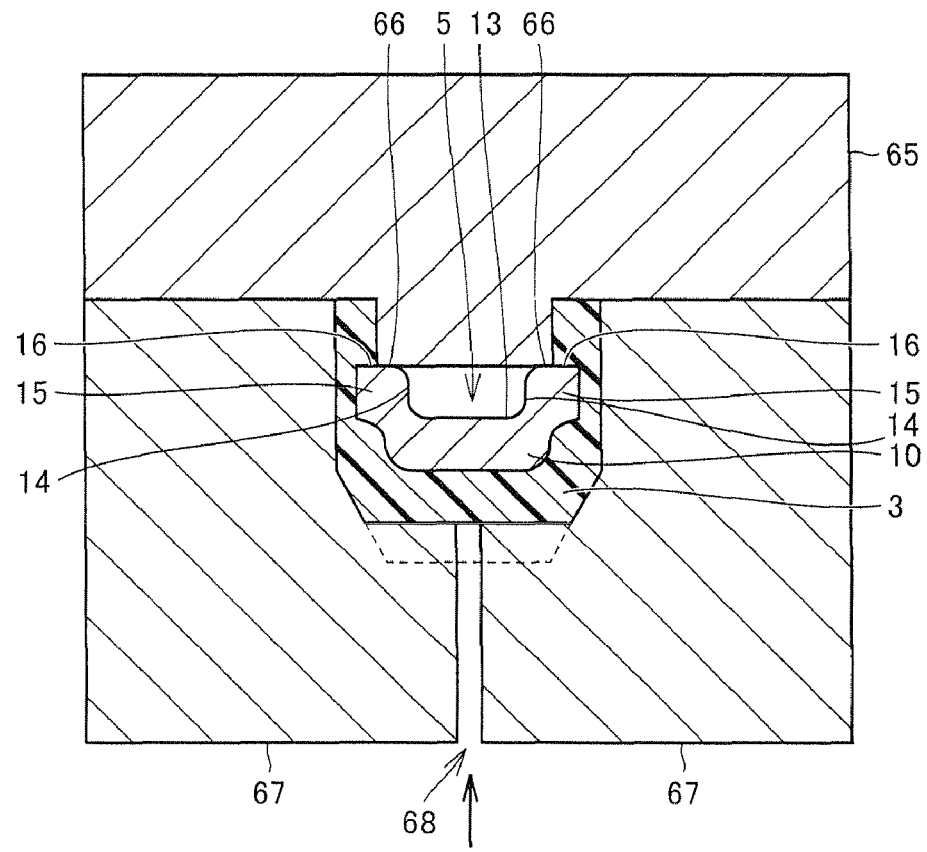
FIG. 6 is a cross sectional view showing a configuration when the light emitting device of Embodiment 1 is insert molded.

FIG. 6 is a cross sectional view showing a configuration when the light emitting device of the present embodiment is insert molded. As shown in FIG. 6, when the light emitting device of the present embodiment is insert molded, two main dies, that is, an upper surface die 65 and a lower surface die 67, are used. With the first lead terminal 10 and the second lead terminal 20 being held in a space formed when upper surface die 65 and lower surface die 67 engage, a resin as a raw material for resin portion 3 is injected from a resin inlet 68 in lower surface die 67, and thereby resin portion 3 is molded.

During insert molding, upper surface die 65 forms an inner wall of cavity 6 exposing a portion of the second lead terminal 20 and the mounting region in the first lead terminal 10 as shown in FIG. 1. Further, an upper surface 66 of a convex portion of upper surface die 65 is in contact with upper surface 16 of collar portion 15 of the first lead terminal 10 on the periphery of an upper end of the inner surface of side wall 14. Furthermore, as described above, resin portion 3 is molded such that a portion of the first terminal portion 17 of the first lead terminal 10 and a portion of the second terminal portion 27 of the second lead terminal 20 project outside resin portion 3 in the shape of a flat plate.

Since resin portion 3 is molded in a state where a portion of upper surface 66 of the convex portion of upper surface die 65 is in contact with a portion of upper surface 16 of collar portion 15, a resin burr in resin portion 3 can be prevented from occurring from upper surface 16 of collar portion 15 to the reflecting surface of side wall 14. By preventing occurrence of a resin burr on the reflecting surface as described above, reduction of luminance of the light emitted from light emitting diode chip 2 is suppressed.

Further, since bottom portion 13, side wall 14, and collar portion 15 of the first lead terminal 10 are formed integrally and continuously, there is no seam or break between bottom portion 13 and side wall 14, preventing a resin burr in resin portion 3 from occurring on the reflecting surface.

In light emitting device 1 in accordance with the present embodiment, a wavelength conversion member (not shown) converting a wavelength of the light emitted from light emitting diode chip 2 is provided inside concave portion 5 formed by bottom portion 13 and side wall 14 of the first lead terminal 10. The wavelength conversion member is formed of a silicon resin containing $(Si.Al)_6(O.N)_8$:Eu as a green phosphor and $CaAlSiN_3$:Eu as a red phosphor. Further, a light-transmitting mold member not shown is provided inside cavity 6 in resin portion 3. The light-transmitting mold member may be formed of a silicon resin not containing the phosphors described above filled in concave portion 5.

The silicon resin filled in concave portion 5 is cured under the conditions of a curing time of one hour and a temperature of 80° C. The light-transmitting mold member filled in cavity 6 is cured under the conditions of a curing time of five hours and a temperature of 150° C.

By the silicon resin filled in concave portion 5, a portion of blue light emitted from light emitting diode chip 2 is converted into red or green light having a wavelength longer than that of the blue light. By converting the light emitted from light emitting diode chip 2 into long-wavelength light having low energy, deterioration of the inner wall of resin portion 3 facing cavity 6 in resin portion 3 due to light reaching the inner wall is suppressed.

Since adhesiveness between a surface of the first lead terminal 10 in which concave portion 5 is formed and the silicon resin is inferior to adhesiveness between the first lead terminal 10 and the polyphthalamide resin forming resin portion 3, the silicon resin is relatively likely to be delaminated from concave portion 5. In the present embodiment, since the light-transmitting mold member is provided inside cavity 6, the silicon resin is sealed between concave portion 5 and the light-transmitting mold member. Therefore, the silicon resin is less likely to be delaminated from concave portion 5.

Further, the wavelength conversion member converting the wavelength of the light emitted from light emitting diode chip 2 may be provided inside cavity 6. Also in this case, by converting the light emitted from light emitting diode chip 2 into long-wavelength light having low energy, deterioration of the inner wall of resin portion 3 facing cavity 6 in resin portion 3 due to light reaching the inner wall is suppressed.

Embodiment 2

Figure 7:
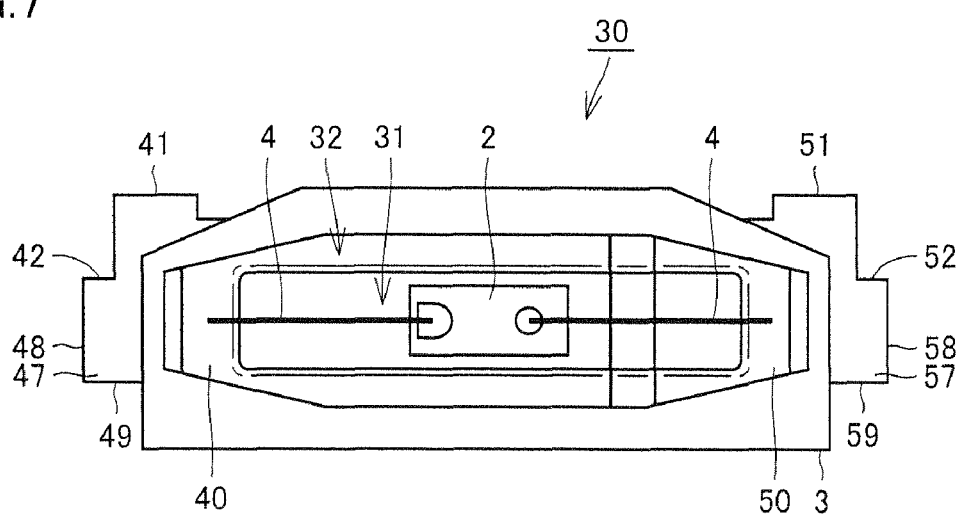
FIG. 7 is a plan view showing a configuration of a light emitting device in accordance with Embodiment 2.

FIG. 7 is a plan view showing a configuration of a light emitting device in accordance with Embodiment 2. As shown in FIG. 7, a light emitting device 30 in accordance with Embodiment 2 includes light emitting diode chip 2 as a light emitting element, resin portion 3, bonding wires 4, a first lead terminal 40, and a second lead terminal 50. Since the configuration is identical to that in Embodiment 1 in respects other than the first lead terminal 40 and the second lead terminal 50, the description thereof will not be repeated.

Figure 8:
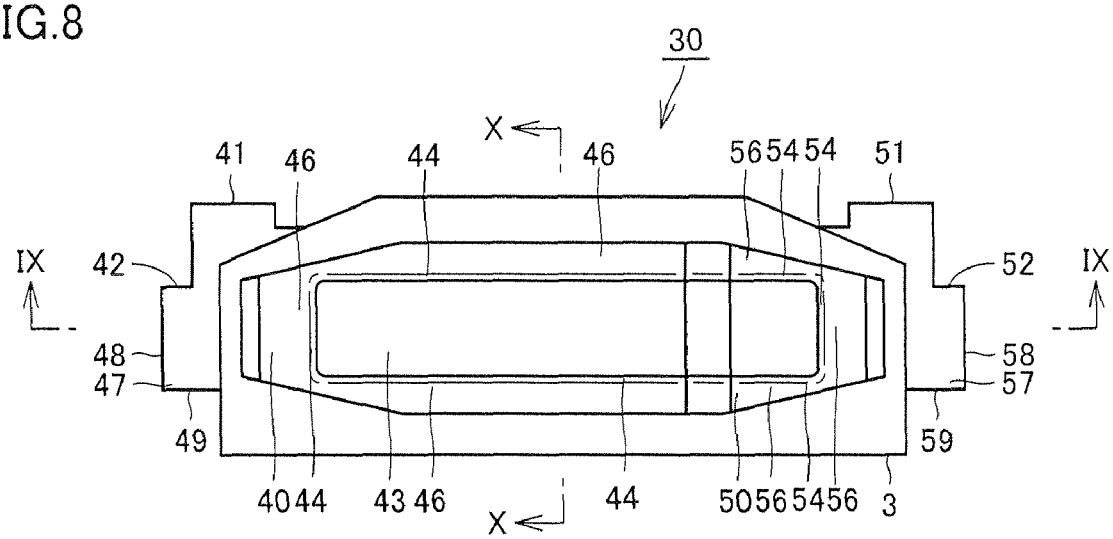
FIG. 8 is a partial plan view showing a structure of the light emitting device in accordance with the Embodiment 2.
Figure 9:
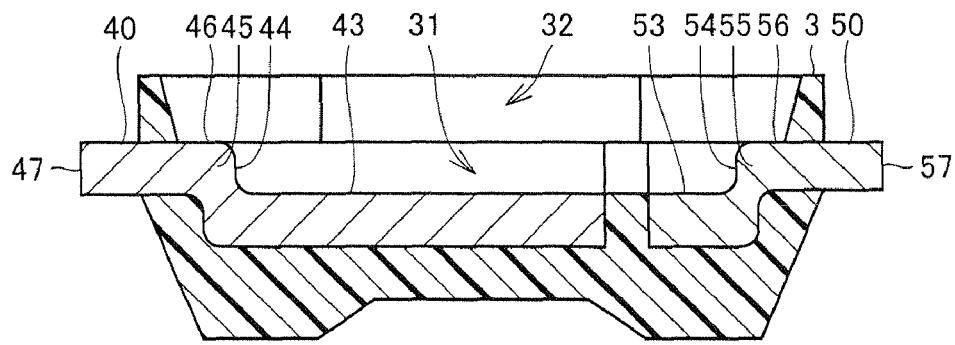
FIG. 9 is a cross sectional view taken along line IX-IX in FIG. 8 and seen in the direction of arrows.
Figure 10:
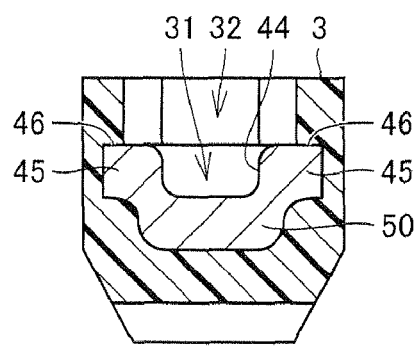
FIG. 10 is a cross sectional view taken along line X-X in FIG. 8 and seen in the direction of arrows.

FIG. 8 is a partial plan view showing a structure of the light emitting device in accordance with the present embodiment. FIG. 9 is a cross sectional view taken along line IX-IX in FIG. 8 and seen in the direction of arrows. FIG. 10 is a cross sectional view taken along line X-X in FIG. 8 and seen in the direction of arrows. In FIGS. 8 to 10, light emitting diode chip 2 and bonding wires 4 are not shown for convenience of description.

As shown in FIGS. 8 to 10, a bottom portion 43 serving as a mounting region for light emitting diode chip 2 is formed in the first lead terminal 40. Further, a side wall 44 continuing to bottom portion 43 is continuously formed in the first lead terminal 40. Side wall 44 has an inner surface serving as a reflecting surface for light emitted from light emitting diode chip 2. The light reflected by side wall 44 passes through a cavity 32 in resin portion 3, and is emitted from light emitting device 30.

Side wall 44 is formed to be slightly inclined with respect to an upper surface of bottom portion 43 such that an opening of a concave portion 31 widens as it approaches a side on which cavity 32 in resin portion 3 is located. Further, a collar portion 45 provided to continuously extend from an upper end of side wall 44 is formed in the first lead terminal 40.

The second lead terminal 50 is provided to be spaced from the first lead terminal 40. An extended bottom portion 53 is formed in the second lead terminal 50 such that bottom portion 43 of the first lead terminal 40 is extended. Further, an extended side wall 54 continuing to extended bottom portion 53 is continuously formed in the second lead terminal 50 such that side wall 44 of the first lead terminal 40 is extended. Extended side wall 54 has an inner surface serving as a reflecting surface for the light emitted from light emitting diode chip 2. The light reflected by extended side wall 54 passes through cavity 32 in resin portion 3, and is emitted from light emitting device 30.

Bottom portion 43 and side wall 44 of the first lead terminal 40 and extended bottom portion 53 and extended side wall 54 of the second lead terminal 50 constitute concave portion 31. Concave portion 31 includes a space above resin portion 3 located between the first lead terminal 40 and the second lead terminal 50. Concave portion 31 has a shape with a short side of 0.4 mm, a long side of 2 mm, and a depth of 0.2 mm. Cavity 32 has a shape with a short side of 0.6 mm, a long side of 2.4 mm, and a depth of 0.3 mm.

Extended side wall 54 is formed to be slightly inclined with respect to an upper surface of extended bottom portion 53 such that the opening of concave portion 31 widens as it approaches the side on which cavity 32 in resin portion 3 is located. Further, an extended collar portion 55 provided to continuously extend from an upper end of extended side wall 54 is formed in the second lead terminal 50 such that collar portion 45 of the first lead terminal 40 is extended.

By disposing light emitting diode chip 2 inside concave portion 31, the light emitted from light emitting diode chip 2 is reflected by side wall 44 and extended side wall 54 in an emitting direction of light emitting device 30, and thus the light is less likely to reach the inner wall of resin portion 3 facing cavity 32 in resin portion 3. As a result, deterioration of the inner wall of resin portion 3 facing cavity 32 in resin portion 3 is suppressed, and reduction of luminance of the light emitted from light emitting device 30 is decreased.

Bottom portion 43, side wall 44, and collar portion 45 of the first lead terminal 40 are formed by drawing. By using drawing, the first lead terminal 40 is formed without having a seam or a break in bottom portion 43, side wall 44, and collar portion 45. Further, since drawing is adaptable to mass production, manufacturing cost can be reduced.

Extended bottom portion 53, extended side wall 54, and extended collar portion 55 of the second lead terminal 50 are formed by drawing. By using drawing, the second lead terminal 50 is formed without having a seam or a break in extended bottom portion 53, extended side wall 54, and extended collar portion 55. Further, since drawing is adaptable to mass production, manufacturing cost can be reduced.

A portion of an upper surface 46 of collar portion 45 of the first lead terminal 40 is covered with resin portion 3 in the vicinity of an outer peripheral end of collar portion 45. Specifically, the upper surface of collar portion 45 of the first lead terminal 40 is covered with resin portion 3 in the vicinity of the outer peripheral end of collar portion 45 along a longitudinal direction of the first lead terminal 40.

Thus, the first lead terminal 40 and resin portion 3 are joined such that resin portion 3 surrounds the vicinity of the outer peripheral end of collar portion 45. Therefore, joining of the first lead terminal 40 to resin portion 3 is strengthened, the risk of separation of the first lead terminal 40 from resin portion 3 is reduced, and the light emitting device has an improved reliability.

A portion of an upper surface 56 of extended collar portion 55 of the second lead terminal 50 is covered with resin portion 3 in the vicinity of an outer peripheral end of extended collar portion 55. Specifically, the upper surface of extended collar portion 55 of the second lead terminal 50 is covered with resin portion 3 in the vicinity of the outer peripheral end of extended collar portion 55 along the longitudinal direction of the first lead terminal 40.

Thus, the second lead terminal 50 and resin portion 3 are joined such that resin portion 3 surrounds the vicinity of the outer peripheral end of extended collar portion 55. Therefore, joining of the second lead terminal 50 to resin portion 3 is strengthened, the risk of separation of the second lead terminal 50 from resin portion 3 is reduced, and the light emitting device has an improved reliability.

Since there is no necessity to additionally provide a lock portion for maintaining joining of the first lead terminal 40 and the second lead terminal 50 to resin portion 3 as described above, a molding die for resin portion 3 can be simplified, suppressing an increase in manufacturing cost.

Further, since the light from light emitting diode chip 2 reflected by side wall 44 of the first lead terminal 40 and extended side wall 54 of the second lead terminal 50 is less likely to reach the inner wall of resin portion 3 facing cavity 32 in resin portion 3 by increasing the area of upper surface 46 of collar portion 45 and upper surface 56 of extended collar portion 55, deterioration of the inner wall of resin portion 3 facing cavity 32 in resin portion 3 is reduced.

In the first lead terminal 40, a first terminal portion 47 projecting outside resin portion 3 in the shape of a flat plate is formed. The first terminal portion 47 is not subjected to bending. In the second lead terminal 50, a second terminal portion 57 projecting outside resin portion 3 in the shape of a flat plate is formed. The second terminal portion 57 is not subjected to bending.

The first terminal portion 47 of the first lead terminal 40 and the second terminal portion 57 of the second lead terminal 50 are respectively electrically connected to outside lands not shown, on first side surfaces 41 and 51 both facing an identical plane, among side surfaces 41, 48, 49, 51, 58, and 59 parallel to respective thickness directions.

Further, in the first terminal portion 47 of the first lead terminal 40, a step portion 42 is formed in second side surface 48 adjacent to the first side surface 41 among side surfaces 41, 48, and 49 parallel to the thickness direction of the first terminal portion 47. Step portion 42 has a function of preventing a member connecting the first terminal portion 47 to the outside from moving upward onto the second side surface 48 in which step portion 42 is formed.

Similarly, in the second terminal portion 57 of the second lead terminal 50, a step portion 52 is formed in second side surface 58 adjacent to the first side surface 51 among side surfaces 51, 58, and 59 parallel to the thickness direction of the second terminal portion 57. Step portion 52 has a function of preventing a member connecting the second terminal portion 57 to the outside from moving upward onto the second side surface 58 in which step portion 52 is formed.

In the present embodiment, the first lead terminal 40 and the second lead terminal 50 are each formed of a lead frame fabricated by working a 0.4 mm-thick metal plate of a copper alloy. The first lead terminal 40 and the second lead terminal 50 are coated with silver plating with a film thickness of 5 μm to improve light reflectivity in side wall 44 and extended side wall 54. As a metal used for plating, Cu, Ni, Au, an Al alloy, a Mg alloy, an alloy of Al and Mg, or the like can be used.

Since there is no need to perform bending on the first lead terminal 40 and the second lead terminal 50, joining of the first lead terminal 40 and the second lead terminal 50 to resin portion 3 can be prevented from being weakened, and light emitting device 30 has an improved reliability. Specifically, joining of the first lead terminal 40 and the second lead terminal 50 to resin portion 3 joined by insert molding is prevented from being weakened, by performing bending on the first lead terminal 40 and the second lead terminal 50 thereafter.

In the present embodiment, during insert molding, a portion of a die forming an inner wall of cavity 32 exposing a portion of the second lead terminal 50 and the mounting region in the first lead terminal 40 is in contact with the upper surface of collar portion 45 of the first lead terminal 40 on the periphery of an upper end of the inner surface of side wall 44. Furthermore, a portion of the die is in contact with the upper surface of extended collar portion 55 of the second lead terminal 50 on the periphery of an upper end of the inner surface of extended side wall 54.

Since resin portion 3 is molded as described above, a resin burr can be prevented from occurring from upper surface 46 of collar portion 45 to the reflecting surface of side wall 44 in the first lead terminal 40. Further, a resin burr can be prevented from occurring from upper surface 56 of extended collar portion 55 to the reflecting surface of extended side wall 54 in the second lead terminal 50. By preventing occurrence of a resin burr on the reflecting surfaces, reduction of luminance of the light emitted from light emitting diode chip 2 is suppressed.

Further, since bottom portion 43, side wall 44, and collar portion 45 of the first lead terminal 40 are formed integrally and continuously, there is no seam or break between bottom portion 43 and side wall 44, preventing a resin burr in resin portion 3 from occurring on the reflecting surface. Similarly, since extended bottom portion 53, extended side wall 54, and extended collar portion 55 of the second lead terminal 50 are formed integrally and continuously, there is no seam or break between extended bottom portion 53 and extended side wall 54, preventing a resin burr in resin portion 3 from occurring on the reflecting surface.

In light emitting device 30 in accordance with the present embodiment, a wavelength conversion member (not shown) converting a wavelength of the light emitted from light emitting diode chip 2 is provided inside concave portion 31. The wavelength conversion member is formed of a silicon resin containing $(Si.Al)_6(O.N)_8$:Eu as a green phosphor and $CaAlSiN_3$:Eu as a red phosphor. Further, a light-transmitting mold member not shown is provided inside cavity 32 in resin portion 3. The light-transmitting mold member may be formed of a silicon resin not containing the phosphors described above filled in concave portion 31.

Also in the present embodiment, by preventing occurrence of a resin burr on the reflecting surfaces, reduction of luminance of the light emitted from the light emitting element is suppressed. Further, since the first lead terminal 40 and the second lead terminal 50 project outside resin portion 3 in the shape of a flat plate, there is no need to perform bending on the first lead terminal 40 and the second lead terminal 50, and joining of the lead terminals to resin portion 3 can be prevented from being weakened.

Figure 11:
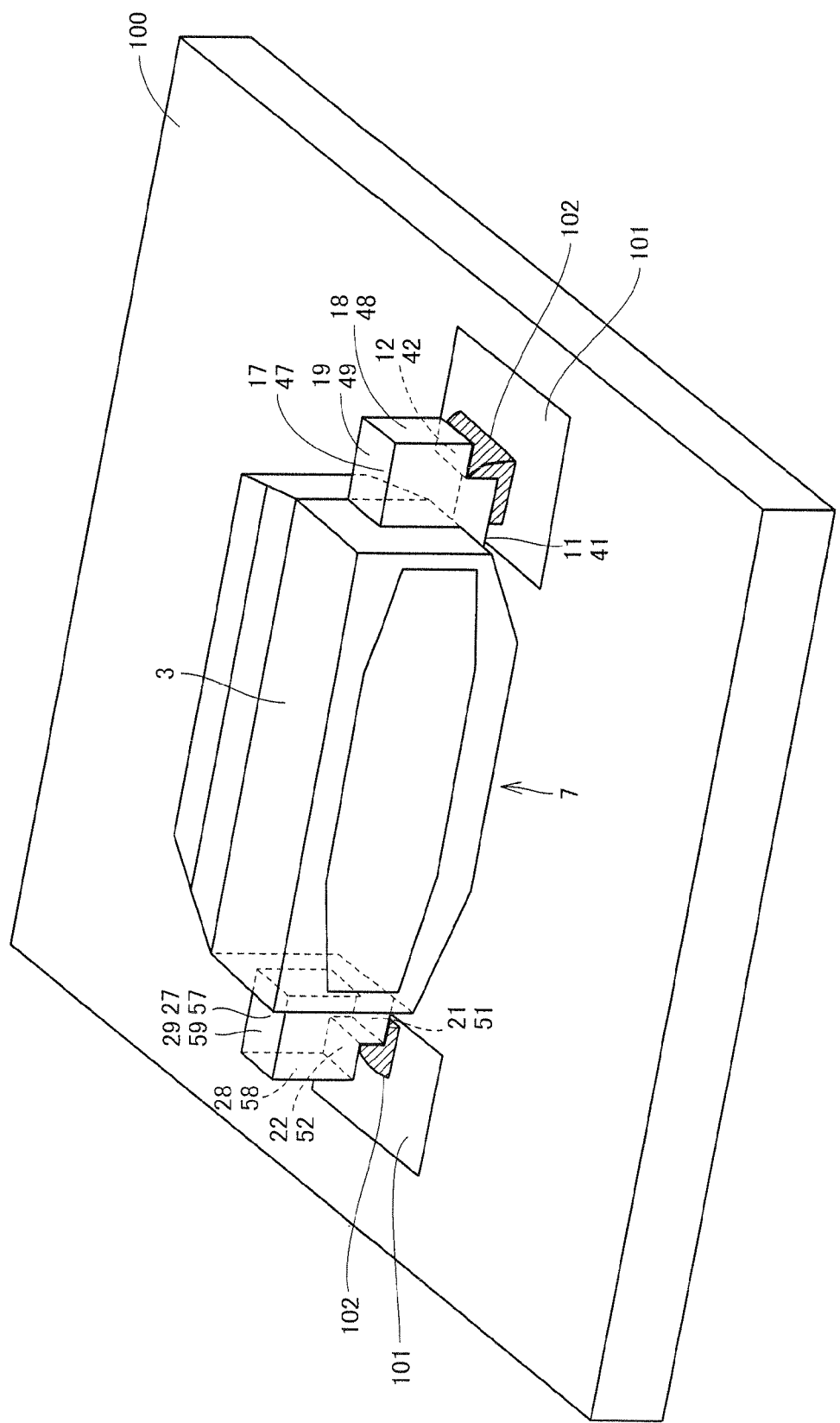
FIG. 11 is a perspective view showing a state where the light emitting device in accordance with Embodiment 1, 2 is mounted on a mounting substrate.

FIG. 11 is a perspective view showing a state where the light emitting device in accordance with Embodiment 1, 2 is mounted on a mounting substrate. In FIG. 11, a brazing filler material 102 is shown with hatching to make it more visible. As shown in FIG. 11, in the light emitting device in accordance with Embodiment 1, 2, a mounting surface 7 is formed on resin portion 3. With mounting surface 7 being in contact with a mounting substrate 100 of the light emitting device, the first side surface 11, 41 of the first terminal portion 17, 47 and the first side surface 21, 51 of the second terminal portion 27, 57 are respectively electrically connected to electrode land patterns 101 on mounting substrate 100, with brazing filler material 102.

Step portion 12, 42 of the first terminal portion 17, 47 can prevent brazing filler material 102 from moving upward onto the second side surface 18, 48 of the first terminal portion 17, 47 in which step portion 12, 42 is formed. Step portion 22, 52 of the second terminal portion 27, 57 can prevent brazing filler material 102 from moving upward onto the second side surface 28, 58 of the second terminal portion 27, 57 in which step portion 22, 52 is formed. Thus, brazing filler material 102 is maintained to remain below the step portion. Therefore, since brazing filler material 102 is stable in shape, mounting strength of the light emitting device with respect to mounting substrate 100 becomes uniform.

Embodiment 3

Figure 12:
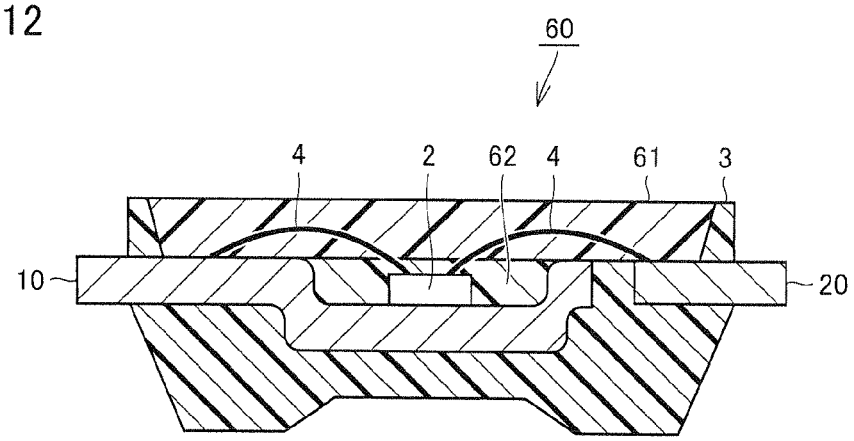
FIG. 12 is a cross sectional view showing a configuration of a light emitting device of a comparative example.

FIG. 12 is a cross sectional view showing a configuration of a light emitting device of a comparative example. As shown in FIG. 12, a light emitting device 60 of the comparative example is prepared by filling concave portion 5 with a phosphor-containing resin 62 and filling cavity 6 with a light-transmitting resin 61 in light emitting device 1 in accordance with Embodiment 1. Since the configuration is identical to that in Embodiment 1 in other respects, the description thereof will not be repeated.

In light emitting device 60 of the comparative example, bonding wires 4 are wired to pass through both phosphor-containing resin 62 and light-transmitting resin 61. In this case, if light emitting device 60 generates heat, there is a risk that bonding wires 4 may be cut in the vicinity of an interface between phosphor-containing resin 62 and light-transmitting resin 61 due to a difference in thermal expansion coefficients of phosphor-containing resin 62 and light-transmitting resin 61.

Figure 13:
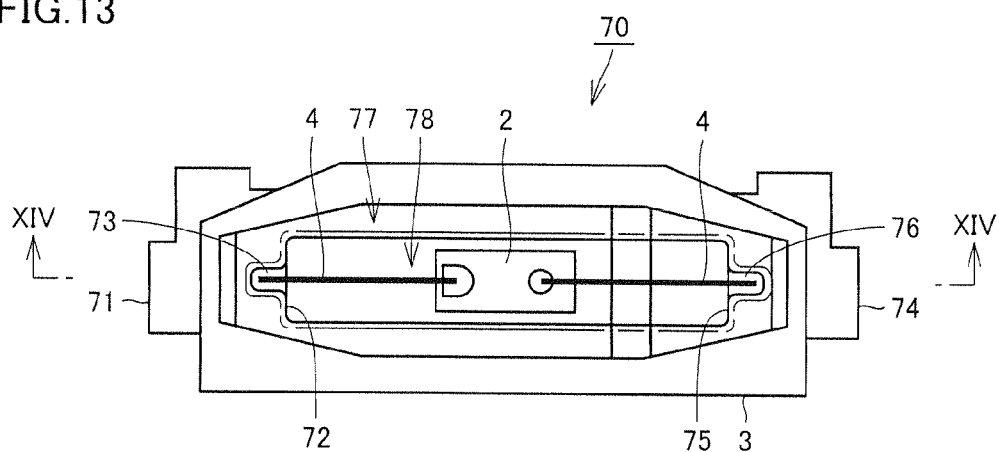
FIG. 13 is a plan view showing a configuration of a light emitting device in accordance with Embodiment 3 of the present invention.
Figure 14:
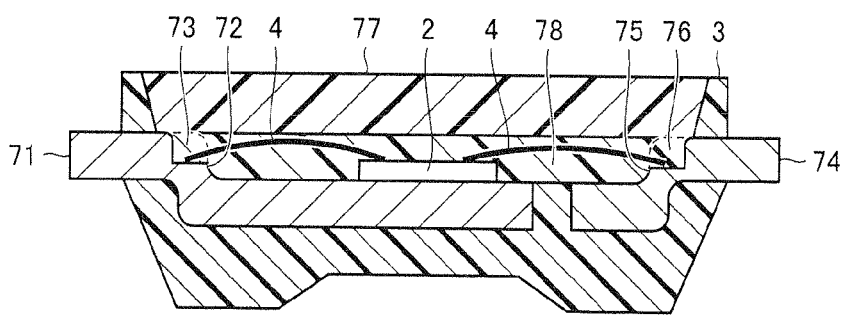
FIG. 14 is a cross sectional view taken along line XIV-XIV in FIG. 13 and seen in the direction of arrows.

FIG. 13 is a plan view showing a configuration of a light emitting device in accordance with Embodiment 3. FIG. 14 is a cross sectional view taken along line XIV-XIV in FIG. 13 and seen in the direction of arrows. As shown in FIGS. 13 and 14, in a light emitting device 70 in accordance with Embodiment 3 of the present invention, a side wall concave portion 73 is formed at a portion of a side wall 72 of a first lead terminal 71. A side wall concave portion 76 is formed at a portion of an extended side wall 75 of a second lead terminal 74.

The first lead terminal 71 is connected with light emitting diode chip 2 by bonding wire 4 at side wall concave portion 73. The second lead terminal 74 is connected with light emitting diode chip 2 by bonding wire 4 at side wall concave portion 76. A phosphor-containing resin 78 is filled in a concave portion formed by the first lead terminal 71 and the second lead terminal 74. A light-transmitting resin 77 is filled in a cavity. Since the configuration is identical to that in Embodiment 2 in other respects, the description thereof will not be repeated.

In the present embodiment, bonding wires 4 are wired inside filled phosphor-containing resin 78. In other words, bonding wires 4 are disposed inside a concave portion formed by a bottom portion and side wall 72 of the first lead terminal 71, and inside a concave portion formed by an extended bottom portion and extended side wall 75 of the second lead terminal 74. Therefore, since bonding wires 4 are not wired to pass through different resins, bonding wires 4 are not affected by thermal expansion of the resins when light emitting device 70 generates heat, and the risk that bonding wires 4 may be cut is reduced.

Embodiment 4

Figure 15:
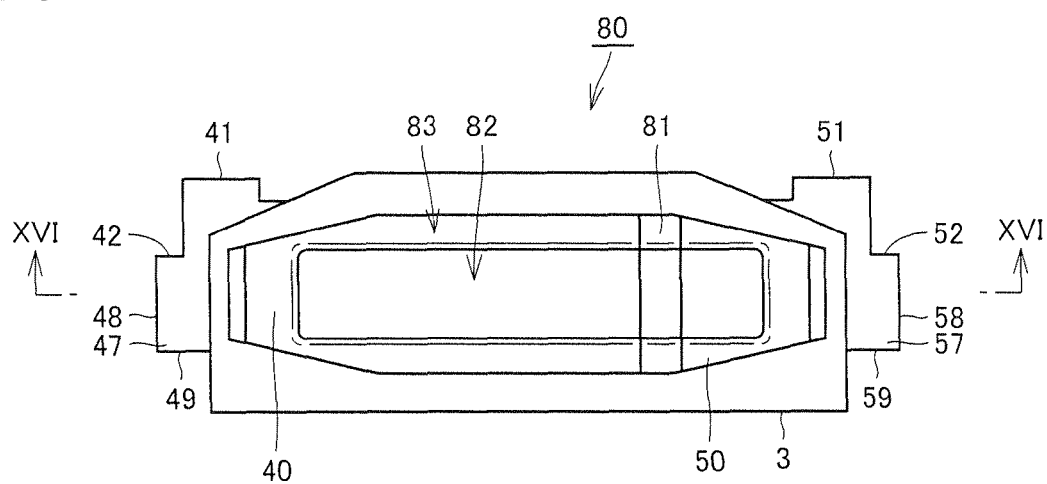
FIG. 15 is a partial plan view showing a configuration of a light emitting device in accordance with Embodiment 4.
Figure 16:
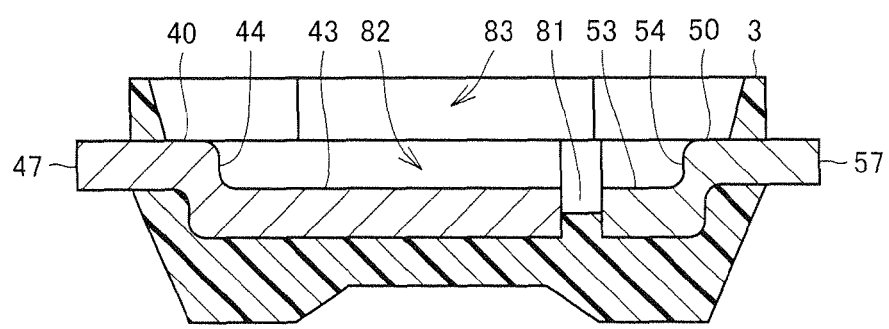
FIG. 16 is a cross sectional view taken along line XVI-XVI in FIG. 15 and seen in the direction of arrows.

FIG. 15 is a partial plan view showing a configuration of a light emitting device in accordance with Embodiment 4. FIG. 16 is a cross sectional view taken along line XVI-XVI in FIG. 15 and seen in the direction of arrows. In FIGS. 15 and 16, light emitting diode chip 2 and bonding wires 4 are not shown for convenience of description.

As shown in FIGS. 15 and 16, in the light emitting device in accordance with Embodiment 4, a level difference 81 is provided by lowering an upper surface of resin portion 3 located between bottom portion 43 of the first lead terminal 40 and extended bottom portion 53 of the second lead terminal 50. Further, level difference 81 is provided by lowering side surfaces of resin portion 3 located between side wall 44 of the first lead terminal 40 and extended side wall 54 of the second lead terminal 50. Since the configuration is identical to that in Embodiment 2 in other respects, the description thereof will not be repeated.

In a light emitting device 80 of the present embodiment, a surface of a concave portion 82 formed by the bottom portion and the side wall of the first lead terminal 40 and the extended bottom portion and the extended side wall of the second lead terminal 50 is formed of a metal material only. The metal material constituting the first lead terminal 40 and the second lead terminal 50 has light reflectivity higher than that of the resin material constituting resin portion 3. Therefore, by forming the surface of concave portion 82 using a metal material only, light emitted from the light emitting diode chip can be reflected efficiently toward a cavity 83. As a result, luminance of light emitted from light emitting device 80 is improved.

Although the present technology has been described and illustrated in detail, it is clearly understood that the same is by way of illustration and example only and is not to be taken by way of limitation, the scope of the present embodiments being interpreted by the terms of the appended claims.

What is claimed is:

1. A light emitting device, comprising:
a light emitting element;
a first lead terminal in which a bottom portion including a mounting region for said light emitting element is formed, and a side wall continuing to said bottom portion and having an inner surface serving as a reflecting surface for light emitted from said light emitting element is continuously formed;
a second lead terminal provided to be spaced from said first lead terminal; and
a resin portion which supports said first lead terminal and said second lead terminal, and in which a cavity exposing a portion of said second lead terminal and said mounting region in said first lead terminal is formed,
a collar portion provided to continuously extend from an upper end of said side wall being formed in said first lead terminal,
said first lead terminal and said resin portion being joined such that a portion of an upper surface of said collar portion is covered with said resin portion in a vicinity of an outer peripheral end of said collar portion and the vicinity of said outer peripheral end of said collar portion is surrounded by said resin portion,
a part of said resin portion covering said portion of the upper surface of said collar portion is thicker than said collar portion at a portion covered with the part.

2. The light emitting device according to claim 1, wherein said first lead terminal has a first terminal portion projecting outside said resin portion in a shape of a flat plate,
said second lead terminal has a second terminal portion projecting outside said resin portion in a shape of a flat plate, and
said first terminal portion and said second terminal portion are respectively electrically connected to outside on first side surfaces both facing an identical plane, among side surfaces parallel to respective thickness directions of said first terminal portion and said second terminal portion.

3. The light emitting device according to claim 2, wherein step portions preventing a member connecting said first terminal portion and said second terminal portion to the outside from moving upward are formed in respective second side surfaces adjacent to said first side surfaces electrically connected to the outside, among the side surfaces parallel to the respective thickness directions of said first terminal portion and said second terminal portion.

4. The light emitting device according to claim 1, wherein in said second lead terminal, an extended bottom portion is formed such that said bottom portion of said first lead terminal is extended, and an extended side wall continuing to the extended bottom portion is continuously formed, further, in said second lead terminal, an extended collar portion provided to continuously extend from an upper end of said extended side wall is formed, and a portion of an upper surface of said extended collar portion is covered with said resin portion in a vicinity of an outer peripheral end of said extended collar portion.

5. The light emitting device according to claim 1, wherein, in said first lead terminal, said bottom portion, said side wall, and said collar portion are formed integrally by drawing.

6. The light emitting device according to claim 4, wherein, in said second lead terminal, said extended bottom portion, said extended side wall, and said extended collar portion are formed integrally by drawing.

7. The light emitting device according to claim 1, wherein a wavelength conversion member converting a wavelength of the light emitted from said light emitting element is provided inside a concave portion formed by said bottom portion and said side wall of said first lead terminal.

8. The light emitting device according to claim 4, wherein a wavelength conversion member converting a wavelength of the light emitted from said light emitting element is provided inside a concave portion formed by said extended bottom portion and said extended side wall of said second lead terminal.

9. The light emitting device according to claim 1, wherein a light-transmitting mold member is provided inside said cavity.

10. The light emitting device according to claim 1, wherein a wavelength conversion member converting a wavelength of the light emitted from said light emitting element is provided inside said cavity.

11. The light emitting device according to claim 4, including bonding wires respectively connecting said first lead terminal and said second lead terminal with said light emitting element, wherein said bonding wires are disposed inside a concave portion formed by said bottom portion and said side wall of said first lead terminal, and inside a concave portion formed by said extended bottom portion and said extended side wall of said second lead terminal.

12. A method of manufacturing a light emitting device, comprising the steps of:

forming a bottom portion including a mounting region for a light emitting element, a side wall continuing to said bottom portion and having an inner surface serving as a reflecting surface for light emitted from said light emitting element, and a collar portion provided to extend from an upper end of the side wall, in a first lead terminal by drawing;

mounting said light emitting element on said first lead terminal; and insert molding said first lead terminal and a second lead terminal disposed to be spaced from said first lead terminal inside a resin portion, wherein, in said step of insert molding, a portion of a die forming an inner wall of said resin portion constituting a cavity exposing a portion of said second lead terminal and said mounting region in said first lead terminal is brought into contact with an upper surface of said collar portion of said first lead terminal on a periphery of an upper end of the inner surface of said side wall, said first lead terminal and said resin portion are joined such that a portion of the upper surface of said collar portion is covered with said resin portion in a vicinity of an outer peripheral end of said collar portion and the vicinity of said outer peripheral end of said collar portion is surrounded by said resin portion, and a part of said resin portion covering said portion of the upper surface of said collar portion is formed thicker than said collar portion at a portion covered with the part.

13. The method of manufacturing a light emitting device according to claim 12, further comprising the step of forming an extended bottom portion, an extended side wall continuing to the extended bottom portion, and an extended collar portion provided to extend from an upper end of the extended side wall, in the second lead terminal by drawing, such that said bottom portion, said side wall, and said collar portion of said first lead terminal are extended, wherein, in said step of insert molding, a portion of the die forming the inner wall of said resin portion constituting the cavity exposing a portion of said second lead terminal and said mounting region in said first lead terminal is in contact with the upper surface of said collar portion of said first lead terminal on the periphery of the upper end of the inner surface of said side wall, and in contact with an upper surface of said extended collar portion of said second lead terminal on a periphery of an upper end of an inner surface of said extended side wall.

\* \* \* \* \*